(12) United States Patent
Wang et al.

(10) Patent No.: US 6,683,501 B2
(45) Date of Patent: Jan. 27, 2004

(54) HIGH SPEED DIGITALLY VOLTAGE CONTROLLED OSCILLATOR

(75) Inventors: Yu-Min Wang, Tainan Hsien (TW); Buh-Yun Jaw, Taipei (TW); Tao-Ting Chang, Taipei (TW)

(73) Assignee: Gemstone Communications, Inc., Taipei (TW)

( * ) Notice: Subject to any disclaimer, the term of this patent is extended or adjusted under 35 U.S.C. 154(b) by 21 days.

(21) Appl. No.: 10/063,039

(22) Filed: Mar. 14, 2002

(65) Prior Publication Data

US 2003/0137360 A1 Jul. 24, 2003

(30) Foreign Application Priority Data

Jan. 22, 2000 (TW) ........................................ 91100919 A

(51) Int. Cl.[7] ................................................. H03L 7/00
(52) U.S. Cl. ........................ 331/1 A; 327/107; 327/299
(58) Field of Search .................. 331/1 A, 55; 327/107, 327/292, 293, 295, 299

(56) References Cited

U.S. PATENT DOCUMENTS 5,974,105 A * 10/1999 Wang et al. ................ 375/376
6,121,816 A * 9/2000 Tonks et al. ................ 327/296
6,281,759 B1 * 8/2001 Coffey .......................... 331/57

* cited by examiner

*Primary Examiner*—Tuan T. Lam
(74) *Attorney, Agent, or Firm*—Jiang Chyun IP Office

(57) ABSTRACT

A high-speed digitally voltage controlled oscillator with 1/N phase resolution, having a load counter, 1/N phase difference generator, a multiplexor, a clock selector, and a load controller. The high-speed digitally voltage controlled oscillator only needs a load counter with an input frequency D+1 (D is far smaller than N) times an output frequency thereof. The phases of first and (M/2+1)th phases of M clock signals with 1/N phase difference (M is far smaller than N) generated by the 1/N phase difference generator are fixed at 0° and 180° with respect to a reference clock. Therefore, only (M/2−1) clock signals are affected by variation of process parameters. Consequently, the high-speed digitally voltage controlled oscillator can tolerate variation error of process parameter and is applicable for high resolution and high frequency operation.

19 Claims, 6 Drawing Sheets

HIGH SPEED DIGITALLY VOLTAGE CONTROLLED OSCILLATOR

CROSS REFERENCE TO RELATED APPLICATIONS

This application claims the priority benefit of Taiwan application Ser. No. 91100919, filed Jan. 22, 2002.

BACKGROUND OF INVENTION

1. Field of the Invention

The present invention relates in general to a digitally voltage controlled oscillator. More particularly, the invention relates to a high-speed digitally voltage controlled oscillator that can avoid excessive phase error caused by process parameter variation, and is applicable to high resolution and high frequency operation.

2. Description of the Related Art

To realize high-speed digital phase locked loop (DPLL), a voltage controlled oscillator (VCO) with a resolution of 1/N phase is typically employed. The operation theory of a high-speed digital phase locked loop includes comparing a frequency of a standard clock signal generated by a crystal oscillator with a frequency of an output clock signal of the high-speed digitally voltage control oscillator via a phase detector. When the frequency of the standard clock signal is larger than the frequency of the output clock signal, the phase detector informs the high-speed digitally voltage controlled oscillator to increase the frequency of the output clock signal. When the frequency of the standard clock signal is smaller than the frequency of the output clock signal, the phase detector informs the high-speed digitally voltage controlled oscillator to decrease the frequency of the output clock signal. When the frequency of the standard clock signal and is the same as the frequency of the output clock signal, the digital phase locked loop is locked, and the current output clock is output.

There are two conventional methods to realize a high-speed digitally voltage controlled oscillator with a resolution of 1/N phase. One method is to use a delay-line, the other is to use a counter with an input frequency N times of an output frequency thereof. Assuming that N=24, the high-speed digitally voltage controlled oscillator requires 24 orders of delay lines to obtain the resolution of 1/24 phase. This many delay lines results in an excessive phase error caused by process parameter variation. As N increases, the situation is worsened. The other method using a counter with an input frequency 24 times an output frequency thereof to obtain the high-speed digitally voltage controlled oscillator with a resolution of 1/24 phase is complex and difficult to fabricate. Such a method is thus only suitable for low resolution and low frequency application.

Accordingly, prior art has the following disadvantages: limited by process parameter variation; and suitable for low resolution and low frequency application only.

SUMMARY OF INVENTION

The invention provides a high-speed digitally voltage controlled oscillator. By reducing the number of delay lines and frequency multiple of the counter, the excessive phase error caused by process parameter variation is avoided, and the high-speed digitally voltage controlled oscillator is applicable for high resolution and high frequency operation.

The high-speed digitally voltage controlled oscillator provided by the invention comprises a load counter, a 1/N phase difference generator (N is an integer larger than 1), a multiplexor, a clock selector and a load controller. The load counter receives a load count and a reference clock signal. After counting zero, the load counter counts a new load count value and continues counting, and outputs the count value. The load count value includes D−1 (D is an integer larger 1), D and D+1. The 1/N phase difference generator is coupled to the load counter to receive the load count value and the reference clock signal, so as to generate M (M is an integer larger than 1). Every two neighboring clock signals have a 1/N phase difference therebetween, and N=M×(D+1). The multiplexor is coupled to the 1/N phase difference generator to receive the clock signals and a clock select signal, so as to select one of the clock signals as an output clock signal. The clock selector is coupled to the multiplexor to receive either a digit carry signal or a digit borrow signal, the count value, and the reference clock signal, and to generate the clock select signal according to either one of the digit carry and regress signals, and the count value. The load controller is coupled to the clock selector and the load controller to receive either the digit carry or regress signal, the clock select signal, the count value and the reference signal, and to output the load count value according thereto.

In one embodiment of the invention, the 1/N phase difference generator comprises a first clock generator, a first set of phase adjusters, a second clock generator and a second set of phase adjusters. The first clock generator is coupled to the load counter to receive the count value and the reference clock signal, and to sample the count value to generate a first clock signal among the clock signals at a positive edge of the reference clock signal. The first set of phase adjusters comprises (M/2−1) phase adjusters coupled to the first clock generator to receive the first clock signal, and to perform phase adjustment, so as to output a second to a (M/2)th clock signals among the clock signals. Thereby, each of the second to the (M/2)th clock signals becomes the 1/N phase delay of the first to the (M/2−1)th clock signals sequentially. The second clock generator is coupled to the first clock generator to receive the first clock signal, and to sample the first clock signal, so as to generate a (M/2+1)th clock signal at the negative edge of the reference clock signal. The second set of phase adjusters comprises (M/2−1) phase adjusters coupled to the second phase generator to receive the (M/2+1)th clock signal, so as to perform phase adjustment and to output the (M/2+2)th to the Mth clock signals. Thereby, each of the (M/2+2)th to the Mth clock signals becomes the 1/N phase delay of each of the (M/2+1)th to the (M−1)th clock signals.

The frequency of the first clock signal is obtained by dividing the frequency of the reference clock signal by the sum of the count value and 1. The frequency of the (M/2+1)th clock signal is the frequency of the reference signal divided by the count value plus 1. The phase difference between the first clock signal and the (M/2+1)th clock signal is 180° with respect to the reference clock signal, while phase of the first clock signal is fixed at 0° with respect to the reference clock signal. The (M/2+1)th clock signal is fixed at 180° with respect to the reference clock signal. In addition, each of the first and second set of adjusters can be adjusted with an arbitrary phase.

In one embodiment of the invention, among any of the second to the Mth clock signals and when the digit carry signal is enabled, the clock signal prior to any of the second to the Mth clock signals is selected by the clock select signal. Among any of the first to the (M−1)th clock signals and when the digit borrow signal is enabled, the clock signal after any of the first to the (M−1)th clock signals is selected by the clock select signal. In the first clock signal and when the digit carry signal is enabled, the load controller loads D−1 into the load counter, and the clock select signal selects the Mth clock signal. In the Mth clock signal and when the digit borrow signal is enabled, the load controller loads D+1 into the load counter, and the clock select signal selects the first clock signal.

The frequency of the reference clock signal is the frequency of the output clock signal multiplied by D+1. The count value includes L digits (L is a positive integer). The load counter includes a down counter.

In the above embodiment, the digit carry and regress signals are generated by a phase detector. When the digit carry signal is enabled, it indicates that the output clock signal has to advance 1/N phase with respect the output clock signal. When the digit borrow signal is enabled, the output clock signal has to delay 1/N phase with respect the output clock signal.

According to the above, the high-speed digitally voltage controlled oscillator requires only one load counter of which the input frequency is D+1 (D is far less than N) of the output frequency. Further, phases of the first and (M/2+1)th clock signals among the Mth (M is far less than N) clock signals with 1/N phase difference generated by the 1/N phase difference generator are fixed at 0° and 180° with respect to the reference clock signal. Therefore, only (M/2−1) clock signals are affected by error caused by process parameter variation, and the high-speed digitally voltage controlled oscillator is applicable to high resolution and high frequency operation.

Both the foregoing general description and the following detailed description are exemplary and explanatory only and are not restrictive of the invention, as claimed.

DETAILED DESCRIPTION

Figure 1:
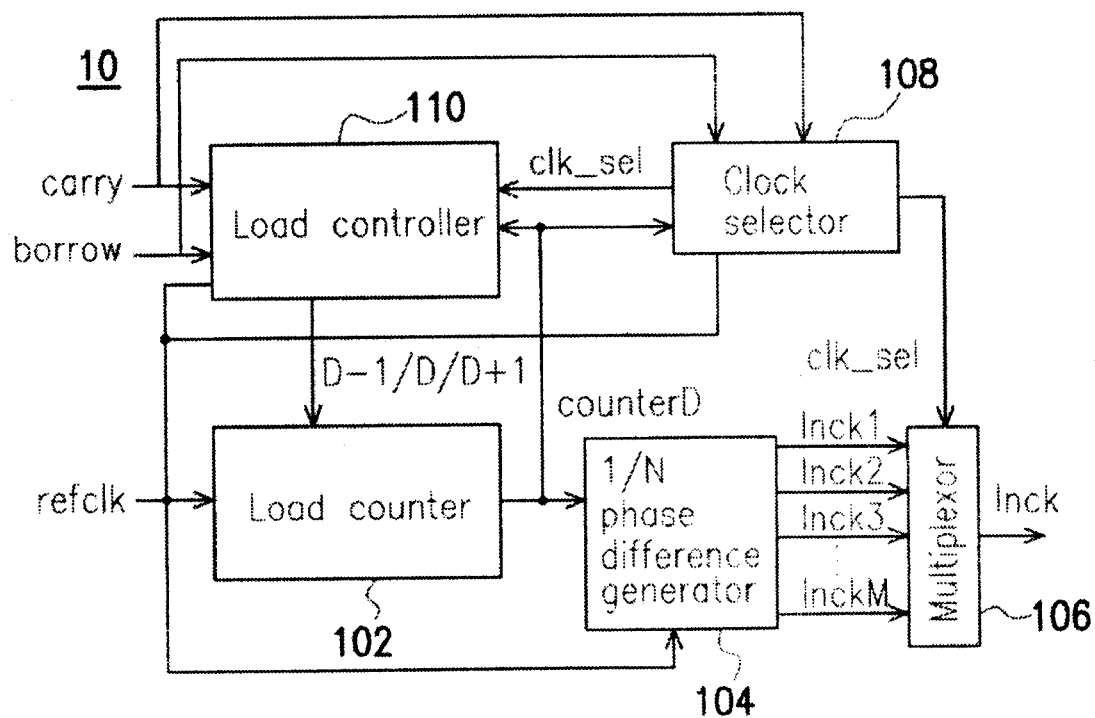
FIG. 1 is a block diagram showing a high-speed digitally voltage controlled oscillator in one embodiment of the invention.

Referring to FIG. 1, a block diagram of a high-speed digitally voltage controlled oscillator in one embodiment of the invention is shown. The high-speed digitally voltage controlled oscillator 10 comprises a load counter 102, a 1/N (N is an integer larger than 1) phase difference generator 104, a multiplexor 106, a clock selector 108 and a load controller 110. The following will describe the operation condition of each part of the high-speed digitally voltage controlled oscillator 10.

The load counter receives a reference clock signal refclk and a load count value (D−1, D, or D+1, where D is an integer larger than 1) from the load controller 110, and outputs an L-bit count value counterD. For the convenience of description, a down counter is used as the load counter 102 as an example hereinafter, while other kinds of counters are also applicable to the load counter 102. As a down counter is used in this embodiment, the count value is counted from D, D−1 to 1, 0, and a new count value is loaded, and the counting is continued.

The 1/N phase difference generator 104 receives the reference clock signal and the count value to generate M clock signals with 1/N phase difference, and N=M×(D+1). The following will describe how the M clock signals are generated. When the counter starts counting down from D, the count value is sampled at a positive edge of the reference clock signal to generate a first clock signal Inck1, of which the frequency is the frequency of the reference clock signal divided by (D+1). (M/2−1) phase adjusters are then used to sequentially generate a second clock signal Inck2 to a (M/2)th clock signals Inck(M/2) with 1/N phase difference with respect to the first clock signal Inck1. That is, Inck2 is the Inck1 with 1/N phase delay, the third clock signal Inck3 is the second clock signal Inck2 with 1/N phase delay. The Inck(M/2) is the (M/2−1)th clock signal Inck(M/2−1) with 1/N phase delay. When the counter starts counting down from D, the Inck1 is sampled at the negative edge of the reference clock signal to generate the (M/2+1)th clock signal Inck(M/2+1), of which the frequency is the frequency of the reference clock signal divided by (D+1). (M/2−1) phase adjusters are used to sequentially generate a (M/2+2)th clock signal to a Mth clock signal with 1/N phase difference with respect to the Inck(M/2+1). That is, Inck(M/2+2) is the Inck(M/2+1) with 1/N phase delay, the (M/2+3)th clock signal Inck(M/2+3) is the (M/2+2)th clock signal Inck(M/2+2) with 1/N phase delay. The InckM is the (M−1)th clock signal Inck(M−1) with 1/N phase delay.

The multiplexor 106 receives the M clock signals and the clock select signal clk_sel from the clock selector 108, and selects one of the M clock signals as the output clock signal Inck.

The clock selector 108 receives the reference clock signal, the count value and a digit carry signal (carry) and a digit borrow signal (borrow) output from a phase detector. The output clock signal Inck is generated by selecting from one of the M clock signals according to the digit carry or borrow signal and the count value. How the clock select signal is varied is explained as follows. While receiving the digit borrow signal, the clock select signal selects the clock signal right after the current output clock signal when the counter counts down to zero. While receiving the digit carry signal and the counter counts down to zero, the clock signal prior to the current output clock signal is selected.

The load controller 110 receives the digit carry or borrow signal, the clock select signal and the reference clock signal to output the load count value to the down counter 102 according to the digit carry or borrow signal and the reference clock signal. The operation of the load controller 10 can be explained with reference to FIGS. 2, 3, 4 and 5.

Figure 2:
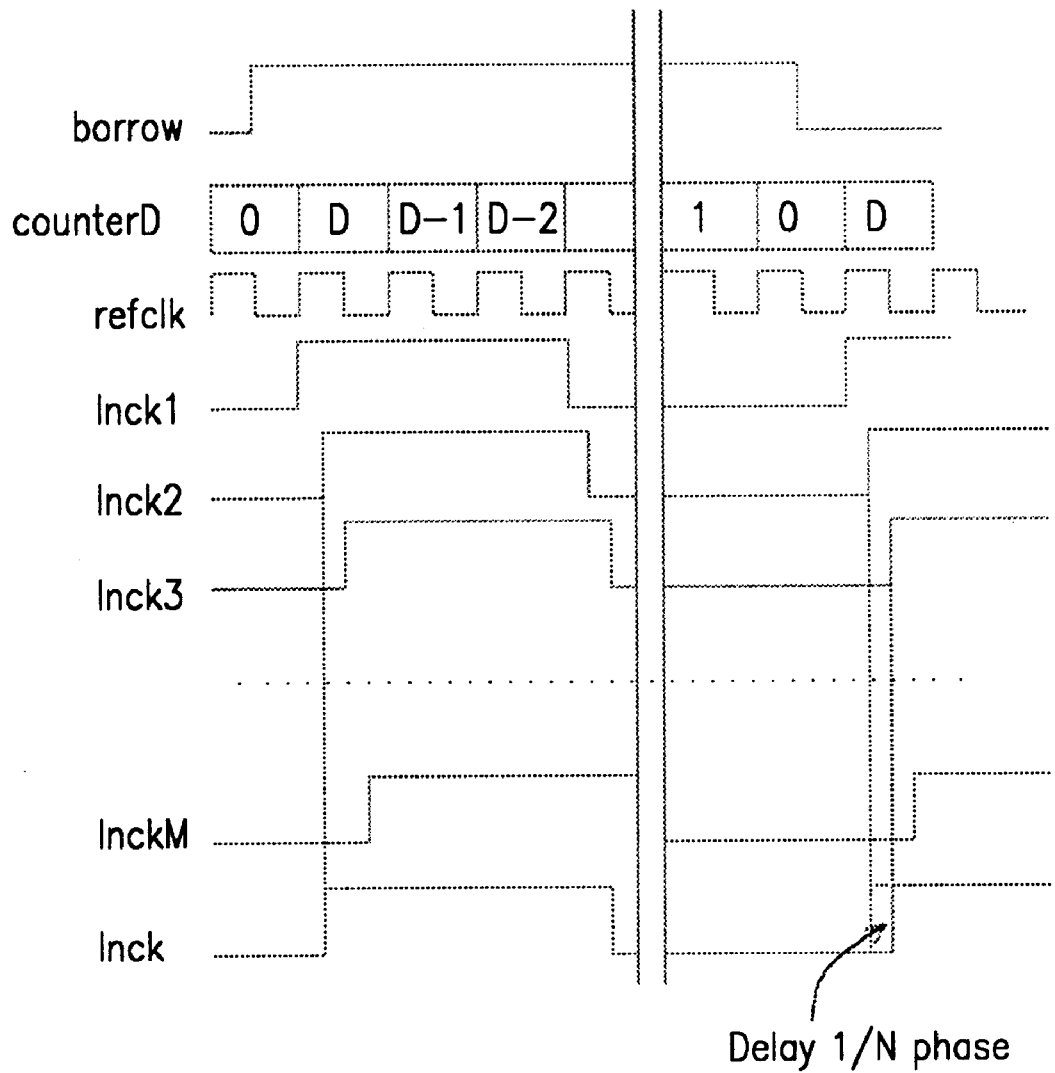
FIG. 2 is an operation timing diagram of a high-speed digitally voltage controlled oscillator in one embodiment of the invention, which shows the clock select signal is in Inck2 and the digit borrow signal is at a high level.

FIG. 2 is an operation timing diagram of a high-speed digitally voltage controlled oscillator when the clock select signal is in the Inck2 and the digit borrow signal is at a high level. In FIG. 2, assuming that the current clock select signal is in Inck2 (that is, Inck=Inck2) and the digit borrow signal is enabled at a high level, 1/N phase delay is required. Under such circumstance, when a new load count value is loaded when the load counter 102 counting down to zero, the third clock signal Inck2 is selected as the select clock signal (that is, Inck=Inck3). The dashed line of the Inck waveform indicates the position of the positive edge of the Inck2 clock before the new load count value is loaded.

Figure 3:
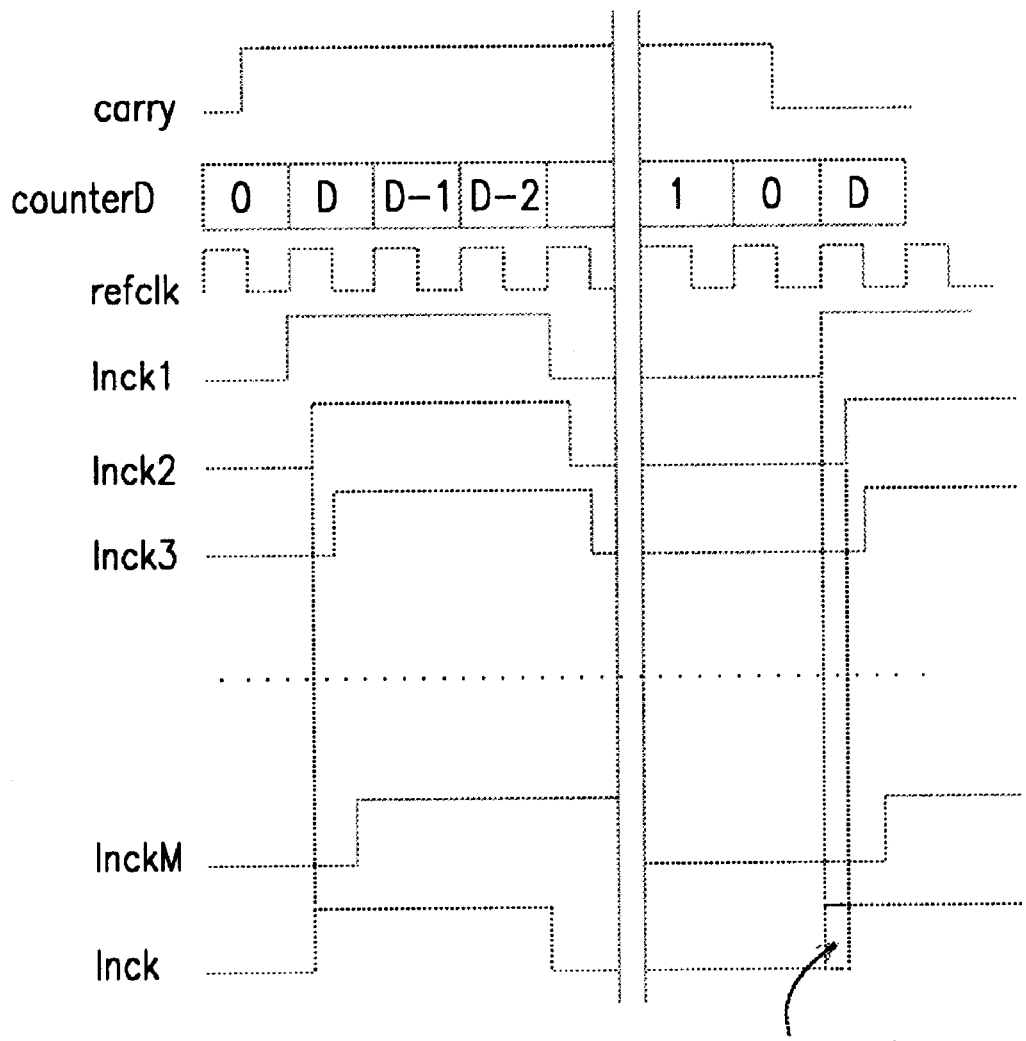
FIG. 3 is an operation timing diagram of a high-speed digitally voltage controlled oscillator with a resolution of 1/N phase in one embodiment of the invention, which shows the clock select signal is in Inck2 and the digit carry signal is at a high level.

FIG. 3 is an operation timing diagram of a high-speed digitally voltage controlled oscillator when the clock select signal is in the Inck2 and the digit carry signal is at a high level. In FIG. 3, assuming that the current clock select signal is in Inck2 (that is, Inck=Inck2) and the digit carry signal is enabled at a high level, 1/N phase advancement is required. Under such a circumstance, when a new load count value is loaded when the load counter 102 is counting down to zero, the first clock signal Inck1 is selected as the select clock signal (that is, Inck=Inck1). The dashed line of the Inck waveform indicates the position of the positive edge of the Inck2 clock before the new load count value is loaded.

Figure 4:
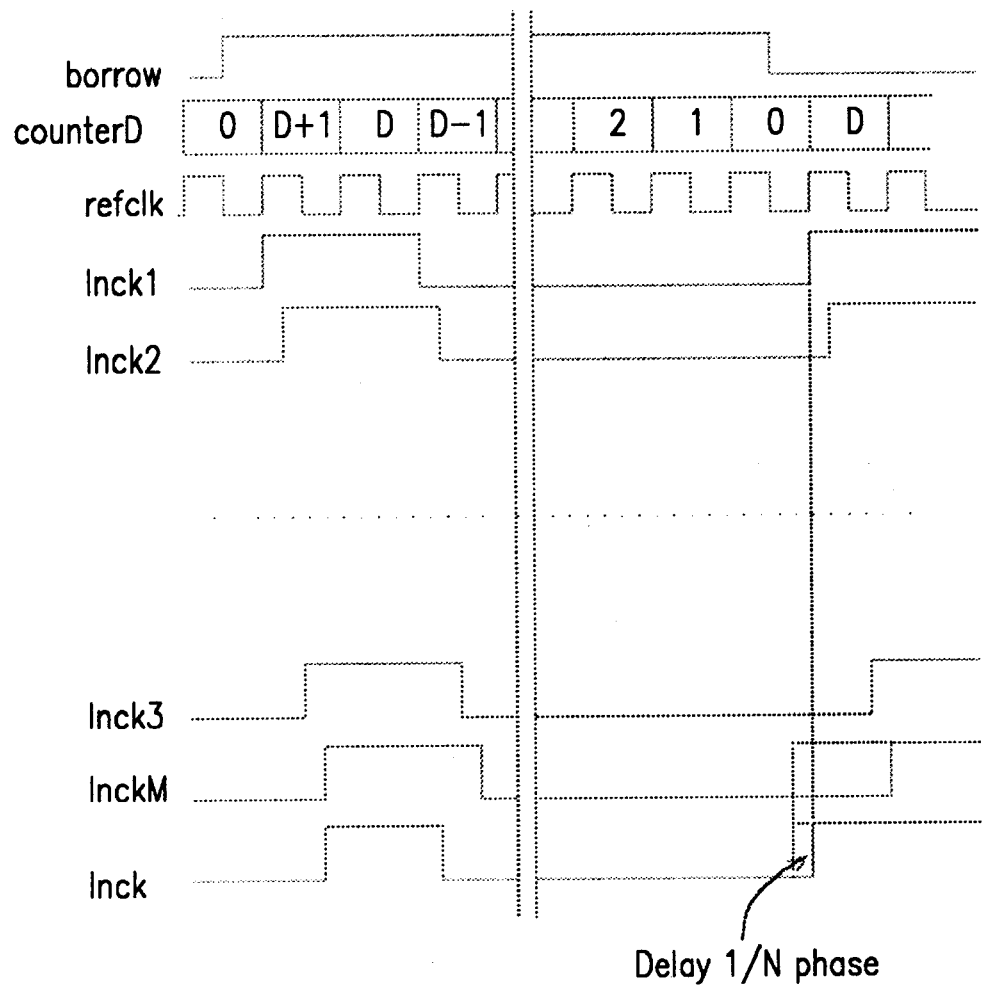
FIG. 4 is an operation timing diagram of a high-speed digitally voltage controlled oscillator in one embodiment of the invention, which shows the clock select signal is in InckM and the digit borrow signal is at a high level.

FIG. 4 is an operation timing diagram of a high-speed digitally voltage controlled oscillator when the clock select signal is in InckM and the digit borrow signal is at a high level. In FIG. 4, assuming that the current clock select signal is in InckM (that is, Inck=InckM) and the digit borrow signal is enabled at a high level, 1/N phase delay is required. Under such circumstance, D+1 is loaded to the load counter 102 by the load controller 110, and the first clock signal Inck1 is selected as the select clock signal (that is, Inck=Inck1). The dashed line of the Inck waveform indicates the position of the positive edge of the InckM before D+1 is loaded.

Figure 5:
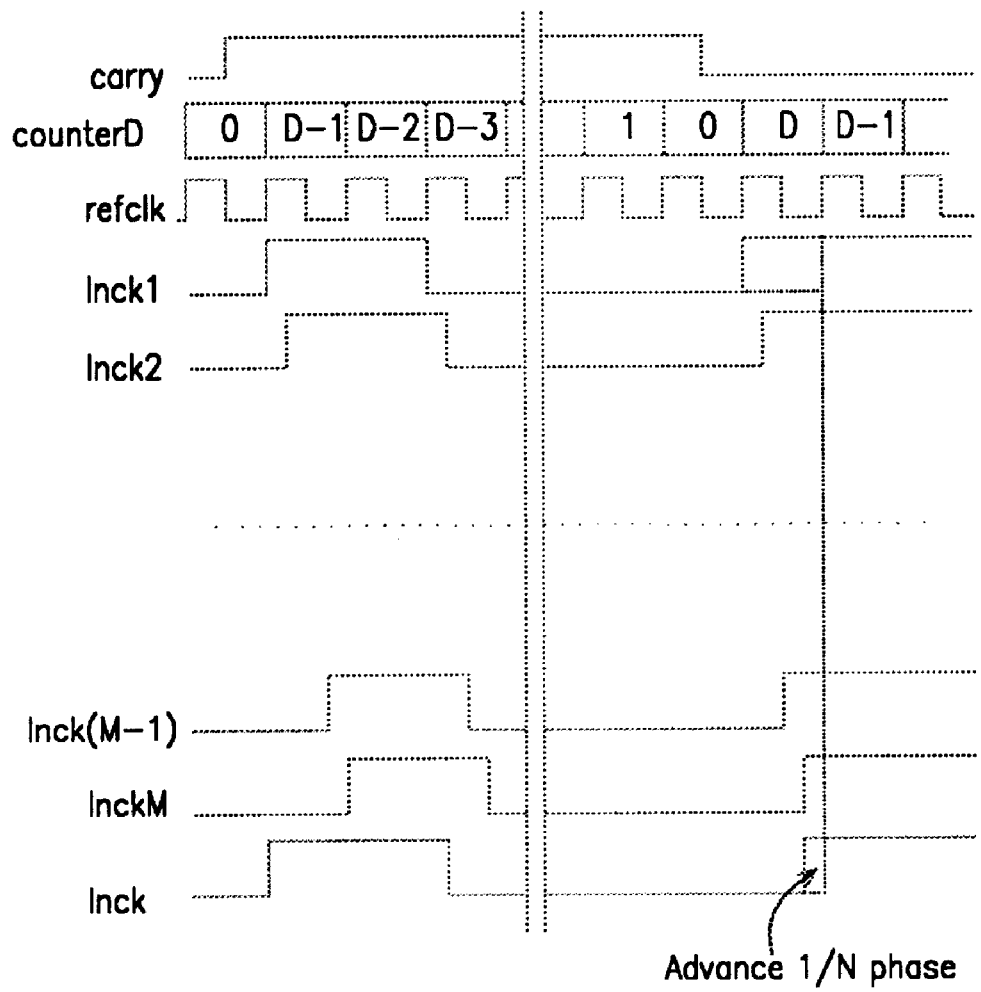
FIG. 5 is an operation timing diagram of a high-speed digitally voltage controlled oscillator in one embodiment of the invention, which shows the clock select signal is in Inck1 and the digit borrow signal is at a high level.

FIG. 5 is an operation timing diagram of a high-speed digitally voltage controlled oscillator when the clock select signal is in the Inck1 and the digit carry signal is at a high level. In FIG. 5, assuming that the clock select signal is in Inck1 (that is, Inck=Inck2) and the digit carry signal is enabled at a high level, 1/N phase advancement is required. Under such a circumstance, D−1 is loaded to the load counter 102 by the load controller 110, and the first clock signal InckM is selected as the select clock signal (that is, Inck=InckM). The dashed line of the Inck waveform indicates the position of the positive edge of the Inck1 clock before the new load count value is loaded.

Figure 6:
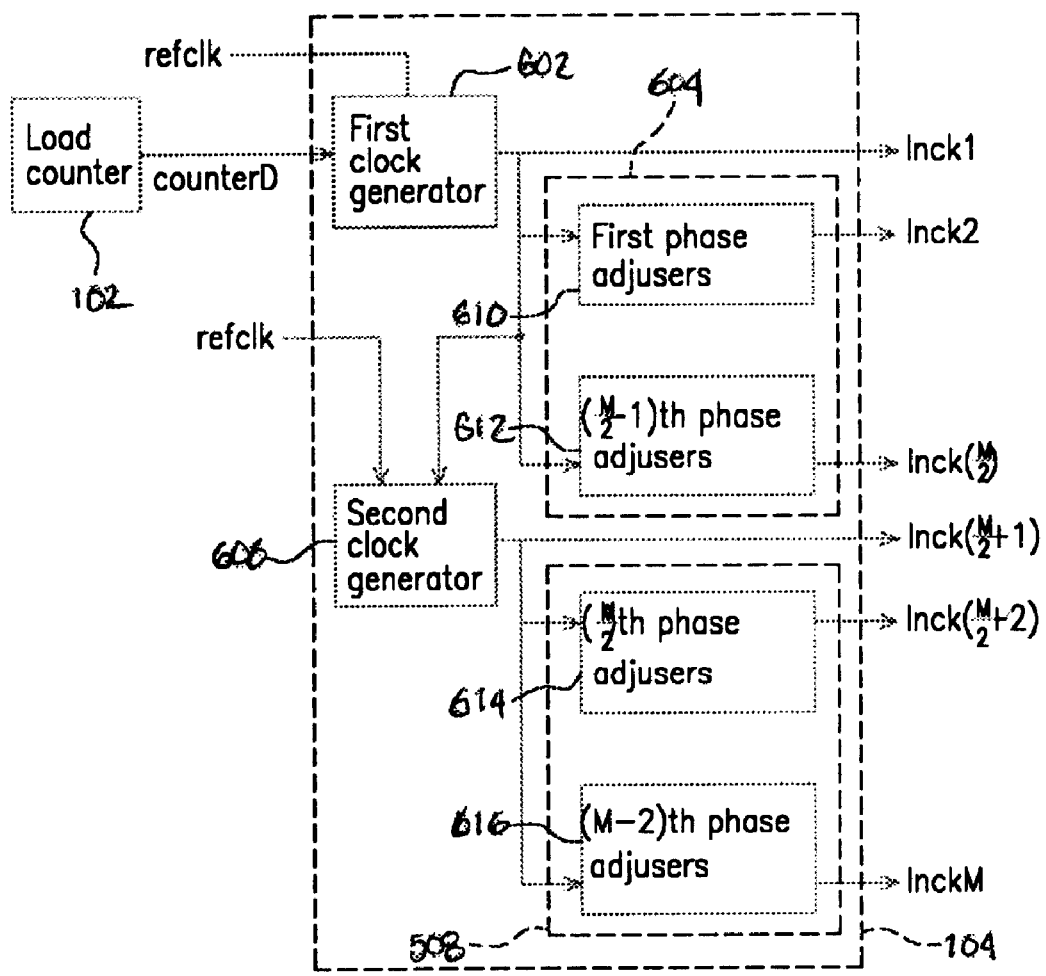
FIG. 6 shows a detailed block diagram of the 1/N phase difference generator as shown in FIG. 1.

Regarding a detailed block diagram of the 1/N phase difference generator 104, please refer to FIG. 6. The 1/N phase difference generator 104 comprises a first clock generator 602, a first set of phase adjusters 604, a second clock generator 606, and a second set of phase adjusters 608. The first set of phase adjusters 604 comprises a first phase adjuster 610 to the (M/2−1)th phase adjuster 612. The second set of adjusters 608 comprises the (M/2)th phase adjuster 614 to the (M−2)th phase adjuster 616. Each portion of the 1/N phase difference generator 104 is described as follows.

The first clock generator 602 is coupled to the load counter 102 to receive the load count and the reference clock signal. The count value is sampled at the positive edge of the reference clock signal to generate Inck1 of the reference clock signal divided by D−1, D or D+1. The phase of the Inck1 is fixed at 0 with respect to the reference clock signal.

The first set of phase adjusters 604 comprises (M/2−1) phase adjusters coupled to the first clock generator 602, so as to receive the Inck1, and to perform phase adjustment and output the Inck2 to Inck(M/2) of the M clock signals. Thereby, each of the clock signals Inck2 to Inck(M/2) is 1/N phase delay of each of the clock signal Inck1 to Inck(M/2−1). That is, the output Inck2 of the first phase adjuster 610 is 1/N phase delay of Inck1. The output Inck(M/2) of the (M/2−1)th phase adjuster 612 is 1/N phase delay of the Inck(M/2−1). The phase of the first to (M/2−1)th phase adjusters 610 to 612 can be adjusted arbitrarily to meet the above requirement.

The second clock generator 606 is coupled to the first clock generator 602 to receive the Inck1 and the reference clock signal. The Inck1 is sampled at the negative edge of the reference clock signal to generate Inck(M/2+1) as the reference clock signal divided by D−1, D or D+1. The phase difference between the Inck1 and the Inck (M/2+1) is 180° with respect to the reference clock signal. That is, the phase of the Inck(M/2+1) is fixed at 180° with respect to the reference clock signal.

The second set of phase adjusters 608 comprises (M/2−1) phase adjusters coupled to the second clock generator 606, so as to receive the Inck(M/2+1), and to perform phase adjustment and output the Inck(M/2+2) to InckM. Thereby, each of the clock signals Inck(M/2+2) to InckM is 1/N phase delay of each of the clock signals Inck(M/2+1) to Inck(M−1). That is, the output Inck(M/2) of the (M/2) phase adjuster 614 is 1/N phase delay of Inck(M/2+1). The output InckM of the (M−2)th phase adjuster 616 is 1/N phase delay of the InckM. The phase of the (M/2)th to (M−2)th phase adjusters 614 to 616 can be adjusted arbitrarily to meet the above requirement.

Since Inck1 and Inck(M/2+1) are fixed at 0° and 180° phase with respect to the reference clock signal, only (M/2−1) clock signals are affected by process parameter variation among the Inck2 to Inck(M/2) and Inck(M/2+1) to InckM generated by the first phase adjuster 610 to the (M/2−1)th phase adjuster 612 and (M/2)th phase adjuster 614 to the (M−2)th phase adjuster 616. Therefore, the problem of excessive phase error caused by process parameter variation is meditated. The smaller M is, the better the effect is.

It is known from the above that the high-speed digitally voltage controlled oscillator breaks through process technique limitation. Not only is the excessive phase error caused by process parameter variation avoided, but also the operation of high resolution and high frequency can be achieved. For example, when N=24, D=5 and M=4, a counter with an input frequency equal to D+1=6 times of the output frequency (instead of 24 times) is used to implement a high-speed digitally voltage controlled oscillator with 1/24 resolution. It is thus applicable to high resolution and high frequency operation. Since M=4, only 4 clock signals (Inck1, Inck2, Inck3 and Inck4) are required, and phases of the Inck1 and Inck3 (equivalent to Inck(M/2+1)) are fixed at 0° and 180° with respect to the reference clock signal, so that the Inck2 and Inck4 have very high tolerance. Therefore, the process parameter variation error is tolerated. Thus, the high-speed digital voltage controlled oscillator can tolerate process parameter variation error and be applied to high resolution and high frequency operation.

According to the above, the invention has the following advantages:

Firstly, only one set of load counter with an input frequency equal to D+1 times of the output frequency is required. The excessive error caused by process parameter variation is tolerated.

Secondly, areference clock signal with a frequency no higher than D+1 times of the frequency of the output clock signal is required.

3Thirdly, oly an M−1 multiplexor to select M clock signals is required.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A high-speed digitally voltage controlled oscillator, comprising;

a load counter, coupled to receive a load count value and a reference clock signal for generating a count value, wherein when the load count value is 0, a new load count value is entered and the load counter continues counting down, and the count value includes D−1, D and D+1, where D is an integer larger than 1;

a 1/N phase difference generator (N is an integer larger than 1), coupled to the load counter to receive the count value and the reference clock signal, and generate M (M is an integer larger than 1) clock signals, wherein every two neighboring M clock signals have a 1/N phase difference, and N=M×(D+1);

a multiplexor, coupled to the 1/N phase difference generator to receive the clock signals and a clock select signal, and to select one of the clock signals as an output clock signal;

a clock selector, coupled to the multiplexor to receive a digit carry signal or a digit borrow signal, the count value and the reference clock signal and to generate the clock select signal according to the selected one of the digit carry signal and the digit borrow signal, the count value and the reference clock signal; and a load controller, coupled to the clock selector and the load count to receive one of the digit carry signal and the digit borrow signal, the clock select signal, the count value, and the reference clock signal, and to output the load count value according to one of the digit carry signal and the digit borrow signal, the clock select signal, and the count value.

2. The high-speed digitally voltage controlled oscillator according to claim 1, wherein the 1/N phase difference generator comprises:

a first clock generator, coupled to the load counter to receive the count value and the reference clock signal, and to sample the count value to generate a first clock signal among the clock signals at a positive edge of the reference clock signal;

a first set of phase adjusters, comprising (M/2−1) phase adjusters coupled to the first clock generator to receive the first clock signal, and to perform phase adjustments, so as to output a second to a (M/2)th clock signal among the clock signals, wherein each of the second to the (M/2)th clock signals becomes the 1/N phase delay of the first to the (M/2−1)th clock signals sequentially;

a second clock generator, coupled to the first clock generator to receive the first clock signal, and to sample the first clock signal, so as to generate a (M/2+1)th clock signal at the negative edge of the reference clock signal; and a second set of phase adjusters, comprising (M/2−1) phase adjusters coupled to the second phase generator to receive the (M/2+1)th clock signal, so as to perform phase adjustment and to output the (M/2+2)th to the Mth clock signals, wherein each of the (M/2+2)th to the Mth clock signals becomes the 1/N phase delay of each of the (M/2+1)th to the (M−1) clock signals.

3. The high-speed digitally voltage controlled oscillator according to claim 2, wherein the first clock signal has a frequency equal to a frequency of the reference clock signal divided by (the count value+1).

4. The high-speed digitally voltage controlled oscillator according to claim 2, wherein the (M/2+1)th clock signal has a frequency equal to a frequency of the reference clock signal divided by (the count value+1).

5. The high-speed digitally voltage controlled oscillator according to claim 2, wherein a phase difference between the first clock signal and the (M/2+1)th clock signal is 180° with respect to the reference clock signal.

6. The high-speed digitally voltage controlled oscillator according to claim 2, wherein the first clock signal has a phase fixed at 0° with respect to the reference clock signal.

7. The high-speed digitally voltage controlled oscillator according to claim 2, wherein the (M/2+1)th clock signal has a phase fixed at 180° with respect to the reference clock signal.

8. The high-speed digitally voltage controlled oscillator according to claim 2, wherein the first set of phase adjusters can be adjusted with arbitrary phase.

9. The high-speed digitally voltage controlled oscillator according to claim 2, wherein the second set of phase adjusters can be adjusted with arbitrary phase.

10. The high-speed digitally voltage controlled oscillator according to claim 2, wherein the clock select signal selects a clock signal prior to any of the second to the Mth clock signals when the clock select signal is in any of the second to the Mth clock signals and the digit carry signal is enabled.

11. The high-speed digitally voltage controlled oscillator according to claim 2, wherein the clock select signal selects a clock signal after any of the first to the (M−1)th clock signals when the clock select signal is in any of the first to the (M−1)th clock signals and the digit borrow signal is enabled.

12. The high-speed digitally voltage controlled oscillator according to claim 2, wherein the clock select signal selects the Mth clock signal when the clock select signal is in the first clock signal and to load controller loads D−1 to the load counter.

13. The high-speed digitally voltage controlled oscillator according to claim 2, wherein the clock select signal selects the first clock signal when the clock select signal is in the Mth clock signal and the load controller loads D+1 to the load counter.

14. The high-speed digitally voltage controlled oscillator according to claim 1, wherein the reference clock signal has a frequency D+1 times of a frequency of the output clock signal.

15. The high-speed digitally voltage controlled oscillator according to claim 1, wherein the count value has L bits, where L is a positive integer.

16. The high-speed digitally voltage controlled oscillator according to claim 1, wherein the load counter comprises a counting down counter.

17. The high-speed digitally voltage controlled oscillator according to claim 1, wherein the digit carry signal and the digit borrow signal are generated by phase detector.

18. The high-speed digitally voltage controlled oscillator according to claim 1, wherein when the digit carry signal is enabled, the output clock signal is advanced by 1/N phase with respect to the output clock signal.

19. The high-speed digitally voltage controlled oscillator according to claim 1, wherein the when the digit borrow signal is enabled, the output clock signal is delayed by 1/N phase with respect to the output clock signal.

* * * * *